United States Patent
En et al.

(10) Patent No.: US 6,713,819 B1
(45) Date of Patent: Mar. 30, 2004

(54) SOI MOSFET HAVING AMORPHIZED SOURCE DRAIN AND METHOD OF FABRICATION

(75) Inventors: William G. En, Milpitas, CA (US); Dong-Hyuk Ju, Cupertino, CA (US); Srinath Krishnan, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/118,364

(22) Filed: Apr. 8, 2002

(51) Int. Cl.[7] .............................................. H01L 29/76
(52) U.S. Cl. ...................... 257/369; 257/16; 257/19; 257/50; 257/51; 257/52; 257/69; 257/131; 257/347; 257/350; 257/351; 257/369; 257/610; 257/612; 257/617
(58) Field of Search ........................ 257/350–351, 257/347, 369, 16, 19, 50–52, 69, 131, 610, 612, 617

(56) References Cited

U.S. PATENT DOCUMENTS

| | | | |
|---|---|---|---|
| 4,717,683 A * | 1/1988 | Parrillo et al. | 437/34 |
| 4,994,866 A * | 2/1991 | Awano | 357/16 |
| 5,528,054 A * | 6/1996 | Ipposhi et al. | 257/66 |
| 5,587,597 A * | 12/1996 | Reedy et al. | 257/351 |
| 5,858,843 A | 1/1999 | Doyle et al. | |
| 5,970,339 A * | 10/1999 | Choi | 438/243 |
| 5,998,807 A * | 12/1999 | Lustig et al. | 257/66 |
| 6,037,617 A * | 3/2000 | Kumagai | 257/262 |
| 6,043,533 A * | 3/2000 | Gardner et al. | 257/336 |
| 6,184,097 B1 | 2/2001 | Yu | |
| 6,225,176 B1 | 5/2001 | Yu | |
| 6,238,960 B1 * | 5/2001 | Maszara et al. | 438/197 |
| 6,284,672 B1 | 9/2001 | Yu | |
| 6,297,115 B1 | 10/2001 | Yu | |
| 6,342,438 B2 * | 1/2002 | Yu et al. | 438/520 |
| 6,475,841 B1 * | 11/2002 | Taylor, Jr. et al. | 438/197 |
| 6,531,743 B1 * | 3/2003 | Hirashita et al. | 257/354 |
| 6,602,758 B2 * | 8/2003 | Kizilyalli et al. | 438/424 |
| 2002/0030203 A1 * | 3/2002 | Fitzgerald | 257/194 |
| 2002/0048910 A1 * | 4/2002 | Taylor, Jr. et al. | 438/486 |
| 2002/0052084 A1 * | 5/2002 | Fitzgerald | 438/282 |
| 2002/0074599 A1 * | 6/2002 | Chi | 257/347 |

FOREIGN PATENT DOCUMENTS

| | | | |
|---|---|---|---|
| JP | 60-91624 | * | 5/1985 |
| JP | 63-226914 | * | 9/1988 |
| JP | 1-268063 | * | 10/1989 |
| JP | 2-000370 | * | 1/1990 |
| JP | 4-349619 | * | 12/1992 |

OTHER PUBLICATIONS

*Parasitic Bipolar Gain Reduction and the Optimization of 0.25–μm Partially Depleted SOI MOSFET's*, Mistry, et al., IEEE Transactions on Electron Devices, vol. 46, No. 11, Nov. 1999.

* cited by examiner

*Primary Examiner*—Nathan J. Flynn
*Assistant Examiner*—Ahmed N. Sefer
(74) *Attorney, Agent, or Firm*—Renner, Otto, Boisselle & Sklar, LLP

(57) ABSTRACT

An integrated circuit formed in semiconductor-on-insulator format. The integrated circuit includes a layer of semiconductor material disposed on an insulating layer, where the insulating layer disposed on a substrate. A first and a second MOSFET are provided such that one of a source and a drain of the first MOSFET is disposed adjacent one of a source and a drain of the second MOSFET. An amorphous region is formed in the layer of semiconductor material and extending from an upper surface of the layer of semiconductor material to the isolation layer. The amorphous region is formed between a crystalline portion of the one of the source and the drain of the first MOSFET and a crystalline portion of the one of the source and the drain of the second MOSFET.

13 Claims, 2 Drawing Sheets

SOI MOSFET HAVING AMORPHIZED SOURCE DRAIN AND METHOD OF FABRICATION

TECHNICAL FIELD

The present invention relates generally to semiconductor devices and the fabrication thereof and, more particularly, to a semiconductor-on-insulator (SOI) MOSFET having an atrophied source and drain to enhance device performance and a method of fabrication.

BACKGROUND

A pervasive trend in modem integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a body region. Disposed above the body region is a gate electrode that defines a channel in the body. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

The fabrication of smaller transistors, and the placement of transistors as close to one another as possible, allows more transistors to be placed on a single monolithic substrate for the formation of a relatively large circuit system in a relatively small die area. Also, SOI wafers offer potential advantages over bulk wafers for the fabrication of high performance integrated circuits. Dielectric isolation and reduction of parasitic capacitance improve circuit performance, and virtually eliminate latch-up in CMOS circuits. In addition, circuit layout in SOI can be greatly simplified and packing density greatly increased if the devices are made without body contacts (i.e., if the body regions of the devices are "floating").

However, MOSFETs formed in SOI format can exhibit parasitic effects due to the presence of the floating body ("floating body effects"). These floating body effects may result in undesirable performance in SOI devices.

In addition, integrated circuit downscaling by omitting isolation regions between adjacent devices can result in performance degrading effects. In SOI FET devices that are place directly adjacent one another (e.g., the source or drain of one device is located directly adjacent the source or drain of another device with no dielectric material formed therebetween), parasitic leakage from the adjacent floating bodies can diminish circuit performance. One solution to reducing leakage current in such an arrangement has been to increase source/drain implant dosages. However, this solution tends to sacrifice optimization of the source/drain junctions with the body and degradation of device performance has resulted.

Accordingly, there exists a need in the art for semiconductor devices, such as MOSFETs, that optimize scale and performance. There also exists a need for corresponding fabrication techniques to make those semiconductor devices.

SUMMARY OF THE INVENTION

According to one aspect of the invention, the invention is directed to an integrated circuit formed in semiconductor-on-insulator format. The integrated circuit includes a layer of semiconductor material disposed on an insulating layer, where the insulating layer disposed on a substrate. A first and a second MOSFET are provided such that one of a source and a drain of the first MOSFET is disposed adjacent one of a source and a drain of the second MOSFET. An amorphous region is formed in the layer of semiconductor material and extending from an upper surface of the layer of semiconductor material to the isolation layer. The amorphous region is formed between a crystalline portion of the one of the source and the drain of the first MOSFET and a crystalline portion of the one of the source and the drain of the second MOSFET.

According to another aspect of the invention, the invention is directed to a method of forming an integrated circuit in semiconductor-on-insulator format. The method includes providing a semiconductor-on-insulator wafer having a layer of semiconductor material disposed on an insulating layer, the insulating layer disposed on a substrate; forming a first gate electrode and a second gate electrode over the layer of semiconductor material, each of the first and the second gate electrode being separated from the layer of semiconductor material by dielectric material; implanting amorphizing ion species into the layer of semiconductor material to form an amorphous semiconductor material portion in the layer of semiconductor material between the first and the second gate electrode and extending from an upper surface of the layer of semiconductor material to the isolating layer; implanting dopant ion species into the layer of semiconductor material to form a first source and a first drain adjacent respective sides of the first gate electrode and one of the first source and the first drain being formed at least in part in the amorphous semiconductor material portion, and to form a second source and a second drain adjacent respective sides of the second gate electrode and one of the first source and the first drain being formed at least in part in the amorphous semiconductor material portion, and wherein the one of the second source and the second drain is disposed adjacent the one of the first source and the first drain; and annealing the wafer to partially recrystallize the amorphous semiconductor material portion to form a crystalline portion of the one of the first source and the first drain, and to form a crystalline portion of the one of the second source and the second drain, wherein an amorphous region remains between the crystalline portion of the one of the first source and the first drain and the crystalline portion of the one of the second source and the second drain.

BRIEF DESCRIPTION OF DRAWINGS

These and further features of the present invention will be apparent with reference to the following description and drawings, wherein.

DISCLOSURE OF INVENTION

Figure 1:
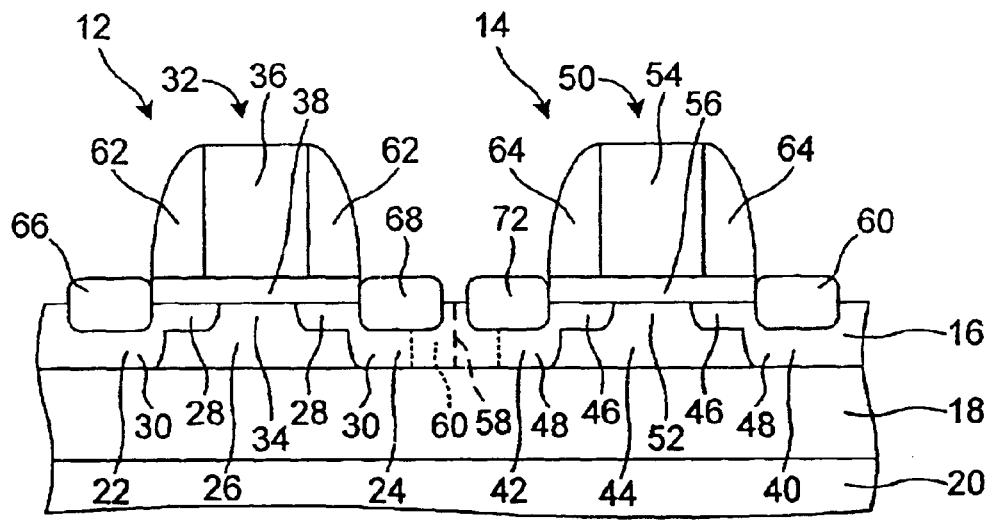
FIG. 1 is a schematic block diagram of two exemplary MOSFETs formed in accordance with the present invention.

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a wafer 10 having a first and a second metal oxide semiconductor field effect transistor (MOSFET) 12 and 14 formed in accordance with an example embodiment of the present invention is illustrated. The illustrated MOSFETs 12 and 14 can be used, for example, in the construction of a complimentary metal oxide semiconductor (CMOS) integrated circuit. One skilled in the art will appreciate that the illustrated devices are merely exemplary and that hundred, thousands or millions of devices formed in accordance with the present invention (including N-channel and/or P-channel devices) can be formed on the wafer 10. As one skilled in the art will appreciate, the structures and the techniques for fabricating the MOSFETs 12 and 14 described herein can be used for other types of semiconductor devices (e.g., other types of transistors, memory cells, etc.) and the illustrated MOSFETs 12 and 14 are merely exemplary.

The illustrated MOSFETs 12 and 14 are arranged to form a CMOS pair. That is, the first MOSFET 12 is arranged as an N-channel device (or NMOS device) and the second MOSFET 14 is arranged as a P-channel device (or PMOS device). It is noted that this arrangement is exemplary and other arrangements are contemplated by the present invention, including, for example, arranging both MOSFETs 12 and 14 as NMOS devices or as PMOS devices.

The MOSFETs 12 and 14 are formed, in part, from a layer of semiconductor material 16. In the illustrated example of FIG. 1, the layer of semiconductor material 16 is a semiconductor film (for example, comprised of silicon, silicon-germanium, or the like) that is formed on a layer of insulating material 18 (for example, a buried oxide (BOX) layer). The insulating layer 18 is, in turn, formed on a semiconductor substrate 20 (also referred to in the art as a handle wafer) so that devices formed on the wafer 10 are formed in a semiconductor-on-insulator (SOI) format. Alternatively, the layer of semiconductor material 16 could be a semiconductor substrate used for the formation of "bulk" type devices.

The first MOSFET 12 includes a source 22, a drain 24 and a body 26 disposed between the source 22 and the drain 24. The source 22 and the drain 24 can be formed by implanting ion species as will be described in greater detail below. In addition, the source 22 and the drain 24 can each be provided with an extension region 28 and a deep doped region 30 as is known in the art. The body 26 can have opposite doping (e.g., in the case of an NMOS device, the body 26 can have P-type doping) as the source 22 and the drain 24 (e.g., in the case of an NMOS device, the source 22 and the drain 24 can have N-type doping). Alternatively, the body 26 can have neutral doping.

A gate 32 is disposed on the layer of semiconductor material 16 over the body 26 and defines a channel 34 within the body 26 (the channel 34 being interposed between the source 22 and the drain 24 and controlled by a work function of the gate 32). The gate 32 includes a gate electrode 36 spaced apart from the layer of semiconductor material 16 by a gate dielectric 38. In one embodiment, the gate electrode 36 can be made from a semiconductor (e.g., polycrystalline silicon, polycrystalline silicon-germanium, etc.). Alternatively, a metal (e.g., tungsten, tantalum, aluminum, nickel, ruthenium, rhodium, palladium, platinum, titanium, molybdenum, etc) or a metal containing compound (e.g., titanium nitride, tantalum nitride, etc.) could also be used for the gate electrode 36.

In one embodiment, the gate dielectric 38 can be made from a standard-K material. As used herein, the term "standard-K dielectric" or "standard-K dielectric material" refers to a dielectric material having a relative permitivity, or K, of up to about ten (10). Relative permitivity is the ratio of the absolute permitivity ($\in$) found by measuring capacitance of the material to the permitivity of free space ($\in_o$), that is K=$\in$/$\in_o$. Example standard-K materials include, for example, silicon dioxide (K of about 3.9), silicon oxynitride (K of about 4 to 8 depending on the relative content of oxygen and nitrogen) and silicon nitride (K of about 6 to 9).

In another embodiment, the gate dielectric 38 can be made from a high-K material or stack of materials to form a high-K dielectric stack. As used herein, a "high-K material" or a "high-K dielectric material" refers to a material, or stack of materials, having a relative permitivity in one embodiment of about ten (10) or more, and in another embodiment of about twenty (20) or more. Although other high-K materials can be selected, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST) are example suitable materials for the gate dielectric 38. In addition, all binary and ternary metal oxides and ferroelectric materials having a K higher than, in one embodiment, about twenty (20) can be used for the gate dielectric 38. When a high-K material is selected as the gate dielectric 34, the high-K material can have an equivalent oxide thickness (EOT) of about one nanometer (1 nm) or less.

Similar to the first MOSFET 12, the second MOSFET 14 includes a source 40, a drain 42 and a body 44 disposed between the source 40 and the drain 42. The source 40 and the drain 42 can be formed by implanting ion species as will be described in greater detail below. In addition, the source 40 and the drain 42 can each be provided with an extension region 46 and a deep doped region 48 as is known in the art. The body 44 can have opposite doping (e.g., in the case of an PMOS device, the body 44 can have N-type doping) as the source 40 and the drain 42 (e.g., in the case of an PMOS device, the source 40 and the drain 42 can have P-type doping) or the body 44 can have neutral doping.

A gate 50 is disposed on the layer of semiconductor material 16 over the body 44 and defines a channel 52 within the body 44 (the channel 52 being interposed between the source 40 and the drain 42 and controlled by a work function of the gate 50). The gate 50 includes a gate electrode 54 spaced apart from the layer of semiconductor material 16 by a gate dielectric 56. In one embodiment, the gate electrode 54 can be made from a semiconductor (e.g., polycrystalline silicon, polycrystalline silicon-germanium, etc.). Alternatively, a metal (e.g., tungsten, tantalum, aluminum, nickel, ruthenium, rhodium, palladium, platinum, titanium, molybdenum, etc) or a metal containing compound (e.g., titanium nitride, tantalum nitride, etc.) could also be used for the gate electrode 56. Similar to the gate dielectric 38, the gate dielectric 56 can be made from a standard-K material or a high-K material.

The MOSFETs 12 and 14 are not separated by a dielectric isolation region (e.g., a shallow trench isolation (STI) region) as is common in the art of semiconductor devices. Rather, the drain 24 of the first MOSFET 12 is placed directly adjacent the drain 42 of the second MOSFET 14 forming a junction 58. In the illustrated embodiment, the junction 58 is a P-N junction. However, if the MOSFET 12 and 14 are of the same type (e.g., NMOS or PMOS) the junction 58 will not be as clearly defined. In alternative arrangements, the source 22, 40 of one MOSFET 12, 14 can be formed adjacent the drain 24, 42 of the other MOSFET 12, 14, or both sources 22, 40 can be formed adjacent one another.

To minimize parasitic leakage between the bodies 26 and 44, an atrophied area (or amorphous region) 60 can be provided. The amorphous region 60 is formed by implanting an amorphizing ion species (e.g., xenon, argon, helium, neon, germanium, silicon, etc.) into the layer of semiconductor material 16 as described in greater detail below. Following such amorphization, the layer of semiconductor material 16 can be partially recrystallized, but damage to the layer of semiconductor material 16 caused by the implanted ions will remain in the drain 24 adjacent the junction 58 and in the drain 42 adjacent the junction 58. It is noted that the amorphous region 60 can have the same doping as the respective drains 24 and 42. Similar amorphous regions 60 can be formed in the source 22 of the first MOSFET 12 and in the source 40 of the second MOSFET 14. In an alternative embodiment, the MOSFETs 12 and 14 can be separated by isolation regions (not shown), such as STI regions.

Without intending to be bound by theory, the amorphous region 60 causes twinning, or damage within the distal deep source and deep drain regions of the MOSFETs 12 and 14 such that the crystalline lattice comprises multiple parts. The distal deep source and drain regions being the portions of the sources 22 and 40 and drains 24 and 42 located near the junctions between devices (e.g., the junction 58) and away from the respective bodies 26 and 44. In one embodiment, the damage is severe, such as complete amorphization of the layer of semiconductor material 16 from an upper surface of the layer of semiconductor material 16 down to the insulating layer 18. In addition, the presence of the amorphous region 60 permits implanted dopant species to penetrate and/or diffuse vertically down to the insulating layer 18. As a result, a leakage conduction path between the bodies 26 and 44 can be reduced such that interaction (e.g., leakage current) between the bodies 26 and 44 can be kept to a minimum. In addition, the spacing between the gates 32 and 50 can be reduced since no isolation region is formed between the MOSFETs 12 and 14.

In addition, the presence of amorphous semiconductor material (described in greater detail below) during the implantation and activation (e.g., by annealing) of the extensions 28 and 46 and/or deep doped regions 30/48 allows for laterally tight junctions between the respective source/drain and body junctions. That is, the amorphous semiconductor allows dopants to rapidly diffuse in a downward direction along damage caused by the amorphization and the dopants tend not to have excessive laterally diffusion. Such results can be achieved with a relatively low thermal cycle (e.g., about 600° C. and higher). As a result, the respective source/drain and body junctions can be well defined and transistor performance enhanced.

The MOSFET 12 can be provided with sidewall spacers 62 as is known in the art for controlling the implantation of dopant species for formation of the deep doped regions 30 of the source 22 and the drain 24. Similarly, the MOSFET 14 can be provided with sidewall spacers 64 for controlling the implantation of dopant species for formation of the deep doped regions 48 of the source 40 and the drain 42.

In addition, the MOSFET 12 can have a source contact 66 and a drain contact 68. The MOSFET 14 can also have a source contact 70 and a drain contact 72. In one embodiment, the source contacts 66 and 70 and the drain contacts 68 and 72 are formed by respectively siliciding the sources 22 and 40 and the drains 24 and 42. The MOSFETs 12 and 14 can also be provided with a gate electrode contacts (not shown) used in establishing electrical connection to the gate electrodes 36 and 54. In embodiments where the gate electrodes 36 and 54 are made from a semiconductor material, the gate electrode contacts can be formed by siliciding the gate electrodes 36 and 54. In other embodiments (e.g., when metal gate electrodes 36 and 54 are used), the gate electrode contacts can be made from another material (such as a metal) or omitted. Other components, such as a cap (or passivation) layer (not shown), vias (not shown), and conductor lines (not shown) to interconnect devices formed on the wafer 10, can also be provided.

Depending on the integrated circuit in which the MOSFETs 12 and 14 will be used, the drain contacts 68 and 72 can be combined into a single contact or can be omitted entirely.

Figure 2:
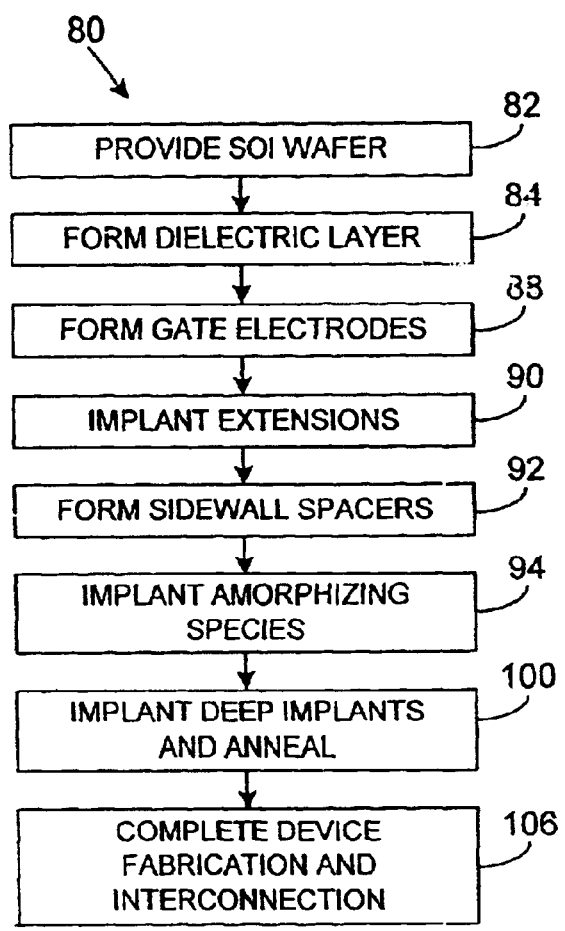
FIG. 2 is a flow chart illustrating an example method of forming the MOSFETs of FIG. 1.

Referring now to FIG. 2, an exemplary method 80 of forming the MOSFETs 12 and 14 is illustrated. With additional reference to FIG. 3A, the method 80 starts in step 82 where the layer of semiconductor material 16 is provided. As indicated above, the layer of semiconductor material 16 can be a semiconductor substrate, such as a silicon substrate. Alternatively, and as illustrated in FIGS. 3A–4D, the layer of semiconductor material 16 can be a semiconductor film (such as a silicon film or a silicon-germanium film) formed on the insulating layer 18 (such as a BOX layer). In one embodiment, the semiconductor film is about 100 Å to about 2,000 Å thick The insulating layer 18 can be formed on the semiconductor substrate 20 (such as a silicon substrate) so as to form an SOI substrate stack. If appropriate, the layer of semiconductor material 16 can be doped with N-type and/or P-type dopant for use in the formation of N-type body regions and/or P-type body regions. Alternatively, the layer of semiconductor material 16 can be left undoped for the formation of undoped body regions. If desired, isolation regions (not shown) can be formed in the layer of semiconductor material 16.

Next, in step 84, a layer of dielectric material 86 is formed over the layer of semiconductor material 16. The layer of dielectric material 86 is used to form the gate dielectrics 38 and 56. If desired, separate dielectric layers for the respective formation of the gate dielectrics 38 and 56 can be used. In an embodiment where a high-K material is selected for the layer of dielectric material 86, a buffer interface material layer (not shown) can be formed between the layer of semiconductor material 16 and the layer of dielectric material 86. For example, the buffer interface layer can be a thin layer of oxide (e.g., silicon oxide that is about 0.5 nm to about 0.7 nm thick). The buffer interface layer can be formed by a low temperature (about 500° C.) thermal oxidation process, a remote plasma deposition process, an atomic layer deposition (ALD) process or the like. The buffer interface layer assists in reducing integration issues that may arise when attempting form a layer of high-K material on a semiconductor layer. Therefore, if the gate dielectric is formed from a standard-K material or if the buffer interface layer is not desired, formation of the buffer interface layer can be omitted.

Thereafter, in step 88, a layer of material used to form the gate electrodes 36 and 54 is grown or deposited over the layer of dielectric material 86. The gate electrode material can be, for example, a doped semiconductor (e.g., polycrystalline silicon, polycrystalline silicon-germanium, etc.). Alternatively, the gate electrode material can be composed of a metal (e.g., tungsten, tantalum, aluminum, nickel, ruthenium, rhodium, palladium, platinum, titanium, molybdenum, etc.) or a metal containing compound (e.g., titanium nitride, tantalum nitride, ruthenium oxide, etc.). In one embodiment, the gate electrodes 36 and 54 can be formed separately and, if desired, from different materials. For example, the material for the gate electrode 36 can be selected or doped for N-channel devices (e.g., tungsten, tantalum, aluminum, titanium nitride, tantalum nitride, or N+ polysilicon) or and the material for the gate electrode 54 can be selected for P-channel devices (e.g., tungsten, nickel, ruthenium, rhodium, palladium, platinum, titanium nitride, tantalum nitride, ruthenium oxide or P+ polysilicon).

After the layer of material(s) used to form the gate electrodes 36 and 54 is formed and doped (if appropriate), the gate electrodes 36 and 54 can be patterned. Techniques for patterning the gate electrodes 36 and 54 will be known to those skilled in the art and will not be described in detail herein. It is noted, however, that the layer of dielectric material 86 used to form the gate dielectrics 38 and 56 can also be patterned so as to be coextensive with the respective gate electrodes 36 and 54. Alternatively, and as illustrated, the layer of dielectric material 86 can be patterned at a subsequent point in the method 80 such that the layer of dielectric material 86 functions as an implant screen for the implantation of ion species as described below.

Figure 3A:
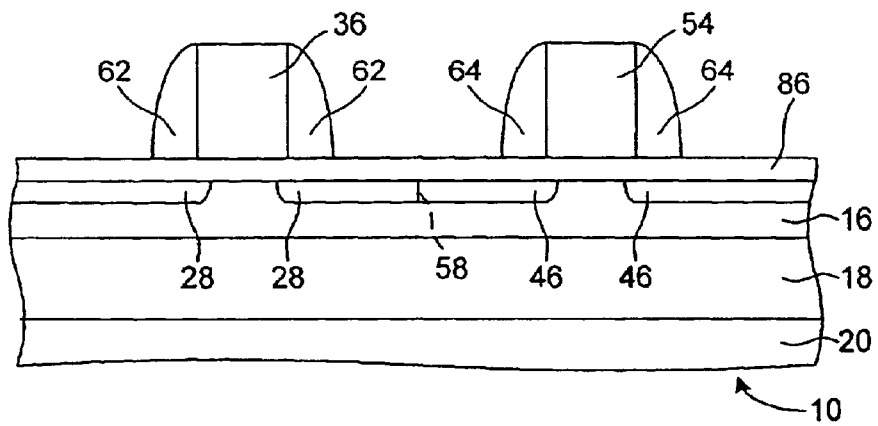
FIGS. 3A through 3D illustrate the MOSFETs of FIG. 1 in various stages of manufacture.

With continued reference to FIG. 3A, the method can continue in step 90 by implanting the extension regions 28 and 46. As one skilled in the art will appreciate separate implant steps can be carried out, along with associated masking steps and mask strip steps; for the formation of N-type extension regions and P-type extension regions. The formation of shallow source 22 and 40 and drain 24 and 42 extensions 28 and 46, such as by using a lightly doped drain (LDD) technique, is well known in the art and will not be described in detail herein. Briefly, for a P-type extension region, ions such as boron, gallium or indium can be implanted. For an N-type extension region, ions such as antimony, phosphorous or arsenic can be implanted. The energy and dosage of the ion species can be determined empirically for the device being fabricated. The implanted ion species may diffuse under the gate electrodes 36 and 54 as is conventional.

Thereafter, in step 92, the sidewall spacers 62 and 64 can be formed adjacent the respective gate electrodes 36 and 54. The sidewall spacers 62, 64 can be formed using conventional techniques. For example, a layer of desired material (e.g., silicon oxide, silicon nitride, silicon oxynitride, etc.) can be deposited to at least the height of the gate electrodes 36 and 54. The deposited material is then polished (using, for example, chemical mechanical planarization, or CMP) back to an upper surface of the gate electrodes 36 and 54 and then anisotropically etched back to the underlying layer (e.g., the layer of dielectric material 86 or, if exposed, the layer of semiconductor material 16).

Figure 3B:
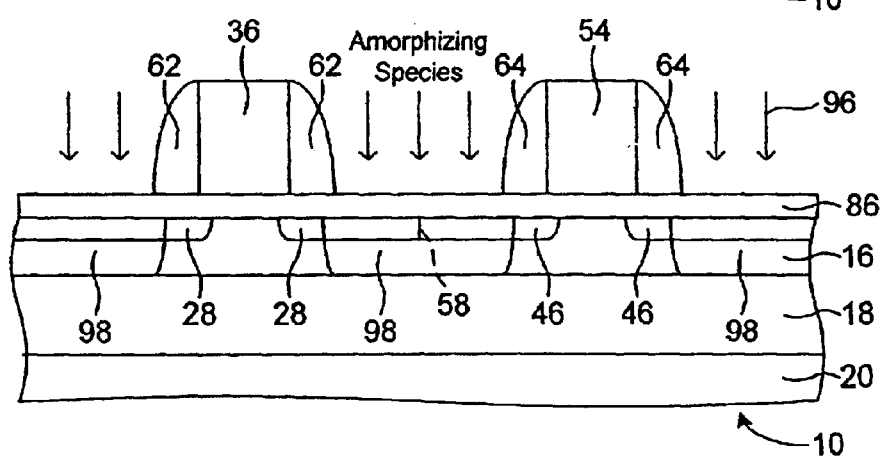

With additional reference to FIG. 3B, the method 80 can continue in step 94 where amorphizing ion species 96 can be implanted to amorphize a portion of the layer of the semiconductor material 16, thereby forming amorphous semiconductor material portions 98 in the layer of semiconductor material 16. The amorphizing species 96 can include, for example, xenon, argon, helium, neon, germanium and silicon. Although the gate electrodes 36 and 54 and the sidewall spacers 62 and 64 will act as a self aligned mask to block ion 96 implantation under the gate electrodes 36 and 54 and sidewall spacers 62 and 64, some amorphizing ions 96 will tend to diffuse under the sidewall spacers 62 and 64. The amorphizing species 96 can be implanted to amorphize the layer of semiconductor material 16 from an upper surface of the layer of semiconductor material 16 down to the insulating layer 18. The depth of amorphization and the distance to which amorphizing ions 96 diffuse under the sidewall spacers 62 and 64 (if diffusion occurs) will depend on the type of ion species, the energy of implantation and the dose. The energy and dose can be calculated empirically for the ion species 96 selected and the specific semiconductor devices being fabricated. In one example embodiment, xenon is selected as the amorphizing species 96 and is implanted with an energy of about 10 keV to about 90 keV with a dose of about $5 \times 10^{13}$ to about $3 \times 10^{15}$.

Figure 3C:
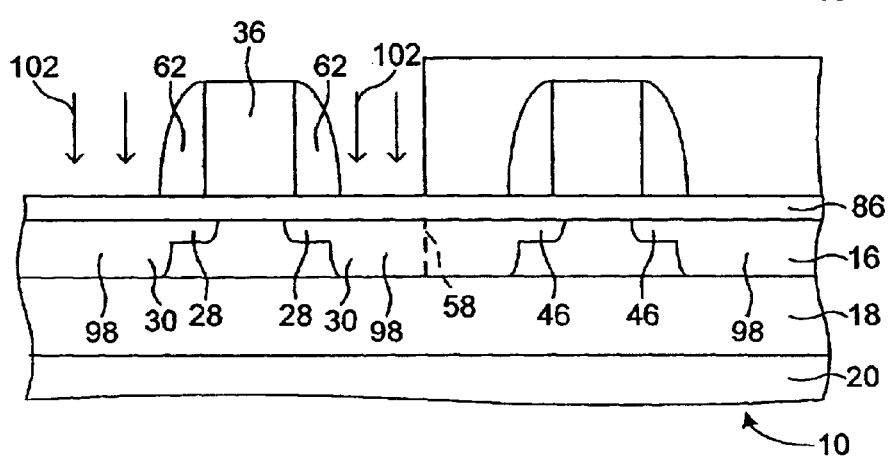
Figure 3D:
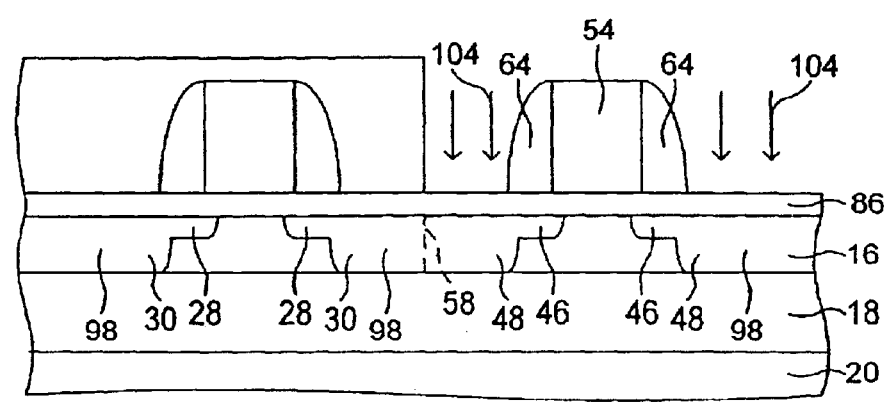

With additional reference to FIGS. 3C and 3D, the method 80 can continue in step 100 where the deep doped regions 30 and 42 are formed. The sidewall spacers 62 and 64 and the gate electrodes 36 and 54 respectively act as a self-aligned mask for the implantation of the deep doped regions 30 and 48. Implanting dopant species to form the deep doped regions 30 and 48 is well known in the art and will not be described in great detail herein. Briefly, as shown in FIG. 3C, step 100 can include masking, ion implantation and most stripping steps for the formation of N or N+ type deep doped regions 30 for the first MOSFET 12. As shown in FIG. 3D, step 100 can also include masking, ion implantation and mask stripping steps for the formation of P or P+ type deep doped regions 48 for the second MOSFET 14. To form N-type deep doped regions 30, ions 102 such as antimony, phosphorous or arsenic can be implanted. P-type deep doped regions 48 can be formed by implanting ions 104 such as boron, gallium or indium. The energy and dosage of the ion species 102 and 104 can be determined empirically for the devices being fabricated. The implanted ions 102 and 104 may laterally diffuse slightly under the sidewall spacers 62 and 64 as is conventional. However, as indicated above, the lateral diffusion of the ions 102 and 104 will tend to be constrained by the presence of the amorphous semiconductor material portions 98 and the ions 102 and 104 will have a tendency to diffuse vertically.

Referring back now to FIG. 1, following implantation of the deep doped regions 30 and 48, an anneal cycle can be carried out to activate the dopant species for the extensions 28 and 46 and to activate the dopant species 102 and 104 for the deep doped regions 30 and 48 respectively. Annealing of the wafer 10 (such as by rapid temperature annealing (RTA), laser annealing and so forth) is well known in the art and will not be described in great detail. In one embodiment, separate anneal cycles can be carried out after implantation of the dopant species 102 and the dopant species 104. An additional anneal cycle or cycles can also be carried out following extension implantation.

It is noted that the anneal cycle (or cycles) can also be used to partially recrystallize the amorphous semiconductor material portions 98. Accordingly, the anneal temperature should be higher than the transformation temperature of the layer of semiconductor material 16 (e.g., about 600° C. for silicon). The unamorphized portions of the layer of semiconductor material 16 (e.g., the portions of the layer of semiconductor material 16 under the gates 36 and 54 and sidewall spacers 62 and 64) can act as a seed crystal for the recrystallization of the amorphous semiconductor regions 98. In one embodiment, the anneal cycle is controlled such that only portions of the amorphous semiconductor material portions 98 adjacent the bodies 26 and 44 are recrystallized so as to leave the amorphous regions 60 in a damaged, amorphous state. In one embodiment, about 200 Å to about 300 Å of atrophied semiconductor material is recrystallized when measured laterally from each edge of the amorphous semiconductor material portions 98. That is, the amorphous regions 60 are about 400 Å to about 600 Å smaller in length than their "parent" amorphous semiconductor material portions 98 and can be roughly centered between adjacent devices. As a result, the sources 22 and 40 and the drains 24 and 42 each include a crystalline portion. In an alternative embodiment, separate anneal cycles to activate the dopant species and to at least partially recrystallize the layer of semiconductor material 16 can be carried out.

As one skilled in the art will appreciate, the amorphizing implant, the sidewall spacers 62 and 64, and the anneal cycle can be controlled to regulate the physical characteristics of amorphous regions 60.

Although portions of the amorphous semiconductor material portions 98 can be recrystallized, some residual damage may remain near the source/drain and body junctions. Without intending to be bound by theory, this residual damage may tend to improve control over the floating body (e.g., by reducing floating body effects, or FBE). It is noted that partially depleted devices have greater susceptibility to floating body effects than fully depleted devices. Although the present invention can be applied to both partially depleted and fully depleted devices, such residual damage could enhance leakage that allows body charge to dissipate. Thus, floating body control could be enhanced, especially in fully depleted devices.

The method 80 can continue in step 106 where any additional processing to complete the formation of the MOSFETs 12 and 14 and to interconnect devices formed on the wafer 10 can be carried out. Such additional processing can include opening the sources 22 and 40 and opening the drains 24 and 42 (e.g., by removing portions of the layer of dielectric material 86 that laterally extend beyond the sidewall spacers 62 and 64). Thereafter, the contact 66, 68, 70 and 72 and the gate electrode contacts (not shown) can be formed. As indicated earlier, undesired contacts can be omitted or contacts can be combined. In the illustrated embodiment, the contacts 66, 68, 70 and 72 are formed from a silicide. Briefly, the silicide can be formed by depositing a layer of metal (such as cobalt, nickel, molybdenum or titanium) and reacting the metal with the layer of semiconductor material 16. Step 106 can also include processing to form, for example, a cap layer (or passivation layer), contact holes or vias, conductor runs and so forth.

In an alternative embodiment, the method 80 can be modified such that the implantation of the amorphizing species is carried out prior to extension 28 and 46 formation. In this alternative embodiment, the amorphous semiconductor material portions 98 will be wider and extend from the drain side sidewall of the gate 36 to drain side sidewall of the gate 54 (it is noted that the source and/or the drain of either or both of the MOSFETs 12 and 14 could be interchanged depending on the devices being fabricated (e.g., NMOS or PMOS) and the integrated circuit configuration). It is believed that the advantages obtained by the amorphizing and partial recrystallization described herein can also be obtained in this modified embodiment.

Although particular embodiments of the invention have been described in detail, it is understood that the invention is not limited correspondingly in scope, but includes all changes, modifications and equivalents coming within the spirit and terms of the claims appended hereto.

What is claimed is:

1. An integrated circuit formed in semiconductor-on-insulator format, comprising:
  a layer of semiconductor material disposed on an insulating layer, the insulating layer disposed on a substrate;
  a first MOSFET, including:
    a first source and a first drain formed in the layer of semiconductor material and a first body disposed between the first source and the first drain, the first source and the first drain each having a crystalline portion adjacent the first body; and
    a first gate electrode disposed over the first body region and separated from the layer of semiconductor material by a first gate dielectric;
  a second MOSFET, including:
    a second source and a second drain formed in the layer of semiconductor material and a second body disposed between the second source and the second drain, the second source and the second drain each having a crystalline portion adjacent the second body; and
    a second gate electrode disposed over the second body region and separated from the layer of semiconductor material by a second gate dielectric;
    wherein one of the second source and the second drain is disposed adjacent one of the first source and the first drain; and
  an amorphous region formed in the layer of semiconductor material and extending from an upper surface of the layer of semiconductor material to the insulating layer, and the amorphous region being formed between the crystalline portion of the one of the second source and the second drain and the crystalline portion of the one of the first source and the first drain; and
  wherein the amorphous region isolates the first MOSFET and the second MOSFET, the first MOSFET is an N-channel device and the second MOSFET is a P-channel device, and the amorphous region contains a PIN junction formed between the one of the second source and the second drain and the one of the first source and the first drain.

2. The integrated circuit according to claim 1, wherein the crystalline portions of the first source, the second source, the first drain and the second drain are recrystallized portions of respective amorphous semiconductor material portions.

3. The integrated circuit according to claim 1, wherein the crystalline portions of the first source, the second source, the first drain and the second drain each have a length of about 200 Å to about 300 Å.

4. The integrated circuit according to claim 1, wherein the crystalline portions of the first source, the second source, the first drain and the second drain each include an extension region and a deep doped region.

5. The integrated circuit according to claim 1, wherein the amorphous region is partly disposed in the one of the second source and the second drain and is partially disposed in the one of the first source and the first drain.

6. The integrated circuit according to claim 1, wherein at least one of the first gate dielectric and the second gate dielectric is composed of a high-K material.

7. The integrated circuit according to claim 1, wherein the first MOSFET and the second MOSFET form a CMOS pair.

8. An integrated circuit formed in semiconductor-on-insulator format, comprising:
  a layer of semiconductor material disposed on an insulating layer, the insulating layer disposed on a substrate;
  a first MOSFET, including:
    a first source and a first drain formed in the layer of semiconductor material and a first body disposed between the first source and the first drain, the first source and the first drain each having a crystalline portion adjacent the first body; and
    a first gate electrode disposed over the first body region and separated from the layer of semiconductor material by a first gate dielectric;

a second MOSFET, including:
- a second source and a second drain formed in the layer of semiconductor material and a second body disposed between the second source and the second drain, the second source and the second drain each having a crystalline portion adjacent the second body; and
- a second gate electrode disposed over the second body region and separated from the layer of semiconductor material by a second gate dielectric;
- wherein one of the second source and the second drain is disposed adjacent one of the first source and the first drain; and an amorphous region formed in the layer of semiconductor material and extending from an upper surface of the layer of semiconductor material to the insulating layer, and the amorphous region being formed between the crystalline portion of the one of the second source and the second drain and the crystalline portion of the one of the first source and the first drain; and wherein the amorphous region contains a PIN junction formed between the one of the second source and the second drain and the one of the first source and the first drain.

9. The integrated circuit according to claim 8, wherein the amorphous region isolates the first MOSFET and the second MOSFET.

10. The integrated circuit according to claim 8, wherein the crystalline portions of the first source, the second source, the first drain and the second drain are recrystallized portions of respective amorphous semiconductor material portions.

11. An integrated circuit formed in semiconductor-on-insulator format, comprising:
- a layer of semiconductor material disposed on an insulating layer, the insulating layer disposed on a substrate;
- a first MOSFET, including:
  - a first source and a first drain formed in the layer of semiconductor material and a first body disposed between the first source and the first drain, the first source and the first drain each having a crystalline portion adjacent the first body; and
  - a first gate electrode disposed over the first body region and separated from the layer of semiconductor material by a first gate dielectric;
- a second MOSFET, including:
  - a second source and a second drain formed in the layer of semiconductor material and a second body disposed between the second source and the second drain, the second source and the second drain each having a crystalline portion adjacent the second body; and
  - a second gate electrode disposed over the second body region and separated from the layer of semiconductor material by a second gate dielectric;
  - wherein one of the second source and the second drain is disposed adjacent one of the first source and the first drain; and
- an amorphous region formed in the layer of semiconductor material and extending from an upper surface of the layer of semiconductor material to the insulating layer, and the amorphous region being formed between the crystalline portion of the one of the second source and the second drain and the crystalline portion of the one of the first source and the first drain; and
- wherein the amorphous region contains dopant species used to form the one of the second source and the second drain and the one of the first source and the first drain.

12. The integrated circuit according to claim 11, wherein the amorphous region isolates the first MOSFET and the second MOSFET.

13. The integrated circuit according to claim 11, wherein the crystalline portions of the first source, the second source, the first drain and the second drain are recrystallized portions of respective amorphous semiconductor material portions.

* * * * *

UNITED STATES PATENT AND TRADEMARK OFFICE
CERTIFICATE OF CORRECTION

PATENT NO. : 6,713,819 B1
APPLICATION NO. : 10/118364
DATED : March 30, 2004
INVENTOR(S) : En et al.

It is certified that error appears in the above-identified patent and that said Letters Patent is hereby corrected as shown below:

Column 1, Line 10: replace "atrophied" with --amorphized--.

Column 1, Line 14: replace "modem" with --modern--.

Column 5, Line 2: replace "atrophied" with --amorphized--.

Column 6, Line 19: replace "3A-4D" with --3A-3D--.

Column 8, Line 16: replace "most" with --mask--.

Column 8, Line 60: replace "atrophied" with --amorphized--.

Claim 1, Line 39: replace "PIN" with --P/N--.

Claim 8, Line 35: replace "PIN" with --P/N--.

Signed and Sealed this

Twenty-second Day of January, 2008

JON W. DUDAS
*Director of the United States Patent and Trademark Office*